United States Patent
Chen et al.

(10) Patent No.: US 10,082,528 B2
(45) Date of Patent: Sep. 25, 2018

(54) POWER DETECTOR

(71) Applicant: MediaTek Inc., Hsin-Chu (TW)

(72) Inventors: Meng-Hung Chen, Cupertino, CA (US); Osama K. A. Shana'a, Los Altos, CA (US); YuenHui Chee, Redwood City, CA (US); Chiyuan Lu, San Jose, CA (US)

(73) Assignee: MediaTek Inc., Hsin-Chu (TW)

( * ) Notice: Subject to any disclaimer, the term of this patent is extended or adjusted under 35 U.S.C. 154(b) by 135 days.

(21) Appl. No.: 14/963,921

(22) Filed: Dec. 9, 2015

(65) Prior Publication Data
US 2016/0334444 A1    Nov. 17, 2016

Related U.S. Application Data

(60) Provisional application No. 62/160,807, filed on May 13, 2015.

(51) Int. Cl.
*G01R 21/07* (2006.01)

(52) U.S. Cl.
CPC .................... *G01R 21/07* (2013.01)

(58) Field of Classification Search
CPC ......... G01R 21/07; G01R 21/06; G01R 1/203
See application file for complete search history.

(56) References Cited

U.S. PATENT DOCUMENTS

| | | | | |
|---|---|---|---|---|
| 4,126,860 A * | 11/1978 | Sullivan | ............... | G01S 13/0209 324/337 |
| 5,017,860 A | 5/1991 | Germer et al. | | |
| 5,604,507 A * | 2/1997 | Openlander | ............. | H01Q 1/50 343/715 |
| 6,205,171 B1 * | 3/2001 | Yang | ......................... | H03F 3/72 375/219 |
| 7,852,150 B1 * | 12/2010 | Arknaes-Pedersen | ....................... | H03F 3/217 330/10 |
| 8,593,219 B1 * | 11/2013 | Root | ..................... | H03F 1/0288 330/124 R |
| 9,128,125 B2 * | 9/2015 | Jackson | ............. | G01R 19/0092 257/536 |

(Continued)

FOREIGN PATENT DOCUMENTS

EP    1235075 A2    8/2002

OTHER PUBLICATIONS

Francois, B. et al. "A Transformer-Coupled True-RMS Power Detector in 40nm CMOS," 2014 IEEE International Solid-State Circuits Conference, p. 62-64.

(Continued)

*Primary Examiner* — Giovanni Astacio-Oquendo
*Assistant Examiner* — Alvaro Fortich
(74) *Attorney, Agent, or Firm* — Wolf, Greenfield & Sacks, P.C.

(57) ABSTRACT

Some embodiments relate to power detector including a voltage sensor configured to detect a voltage of a load and a current sensor configured to detect a current of the load. The power detector also includes circuitry configured to introduce a phase delay between the detected voltage of the load and the detected current of the load, thereby producing a voltage measurement and a current measurement. The circuitry is also configured to multiply the voltage measurement and the current measurement.

28 Claims, 19 Drawing Sheets

(56) References Cited

U.S. PATENT DOCUMENTS

| | | | |
|---|---|---|---|
| 2002/0024403 A1* | 2/2002 | du Toit | H01P 5/028 333/17.3 |
| 2002/0175747 A1* | 11/2002 | Tang | G05F 3/08 327/545 |
| 2006/0160501 A1* | 7/2006 | Mendolia | H01P 5/04 455/125 |
| 2006/0176046 A1* | 8/2006 | Walker | G01R 21/06 324/142 |
| 2007/0241816 A1* | 10/2007 | Okazaki | H03F 1/32 330/149 |
| 2007/0249388 A1* | 10/2007 | Sorrells | H03D 7/165 455/552.1 |
| 2008/0031383 A1* | 2/2008 | Magoon | H03C 5/00 375/300 |
| 2010/0201346 A1 | 8/2010 | You | |
| 2011/0273164 A1 | 11/2011 | Dupuis | |
| 2011/0298549 A1* | 12/2011 | Luong | H03B 5/24 331/57 |
| 2012/0161513 A1* | 6/2012 | Ohshima | H02M 7/1626 307/11 |
| 2012/0250370 A1* | 10/2012 | Taniguchi | H02M 3/33561 363/34 |
| 2014/0031998 A1* | 1/2014 | Mukherjee | H02J 3/28 700/291 |
| 2014/0050282 A1* | 2/2014 | Watanabe | H03F 1/3247 375/296 |
| 2014/0085006 A1* | 3/2014 | Mostov | H03F 1/0227 330/295 |
| 2014/0333025 A1* | 11/2014 | Amireh | A63F 1/02 273/293 |

OTHER PUBLICATIONS

Extended European Search Report for Application No. EP 16169467.4 dated Nov. 4, 2016.

* cited by examiner

POWER DETECTOR

CROSS-REFERENCE TO RELATED APPLICATIONS

This application claims priority to U.S. provisional application Ser. No. 62/160,807, titled "POWER DETECTOR AND CALIBRATION METHOD," filed May 13, 2015, which is hereby incorporated by reference in its entirety.

BACKGROUND

1. Technical Field

The techniques described herein relate to accurately detecting power delivered to a load, such as the power delivered to an antenna by a power amplifier.

2. Discussion of the Related Art

In radio frequency (RF) communications, a radio signal is transmitted by driving an antenna using a power amplifier. Various techniques have been proposed for measuring the power delivered to an antenna, however, they suffer from limitations that affect the accuracy of the power measurement.

SUMMARY

Some embodiments relate to power detector including a voltage sensor configured to detect a voltage of a load and a current sensor configured to detect a current of the load. The power detector also includes circuitry configured to introduce a phase delay between the detected voltage of the load and the detected current of the load, thereby producing a voltage measurement and a current measurement. The circuitry is also configured to multiply the voltage measurement and the current measurement.

Some embodiments relate to a power detection method. The method includes detecting a voltage of a load. The method also includes detecting a current of the load. The method additionally includes introducing a phase delay between the detected voltage of the load and the detected current of the load, thereby producing a voltage measurement and a current measurement. The method further includes multiplying the voltage measurement and the current measurement.

The foregoing summary is provided by way of illustration and is not intended to be limiting.

BRIEF DESCRIPTION OF DRAWINGS

In the drawings, each identical or nearly identical component that is illustrated in various figures is represented by a like reference character. For purposes of clarity, not every component may be labeled in every drawing. The drawings are not necessarily drawn to scale, with emphasis instead being placed on illustrating various aspects of the techniques and devices described herein.

DETAILED DESCRIPTION

As mentioned above, various techniques have been proposed for accurately measuring load power, but they suffer from limitations that affect their accuracy.

Figure 1:
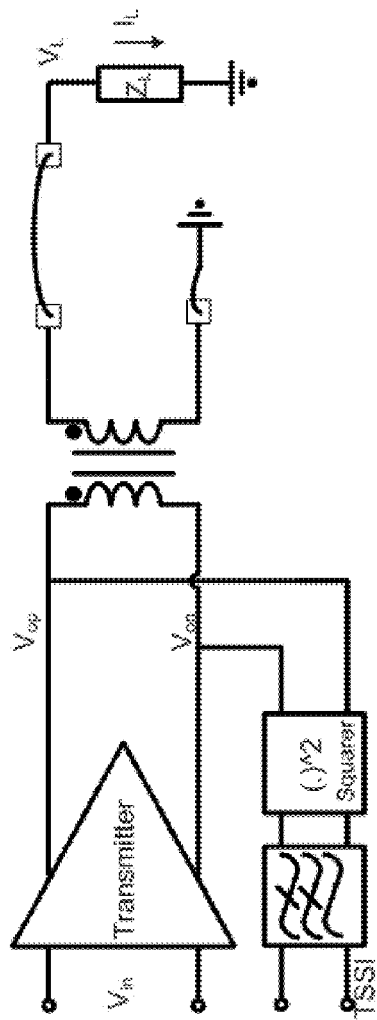
FIG. 1 shows a technique for detecting power that involves squaring the voltage at the output of a transmitter.

FIG. 1 shows a technique for detecting power that squares the voltage at the output of a transmitter, and calculates power based on Pout=$V^2_{out}/Z_L$. However, a difficulty with this technique is that the load impedance $Z_L$ may vary, which may lead to an inaccurate power calculation.

Figure 2:
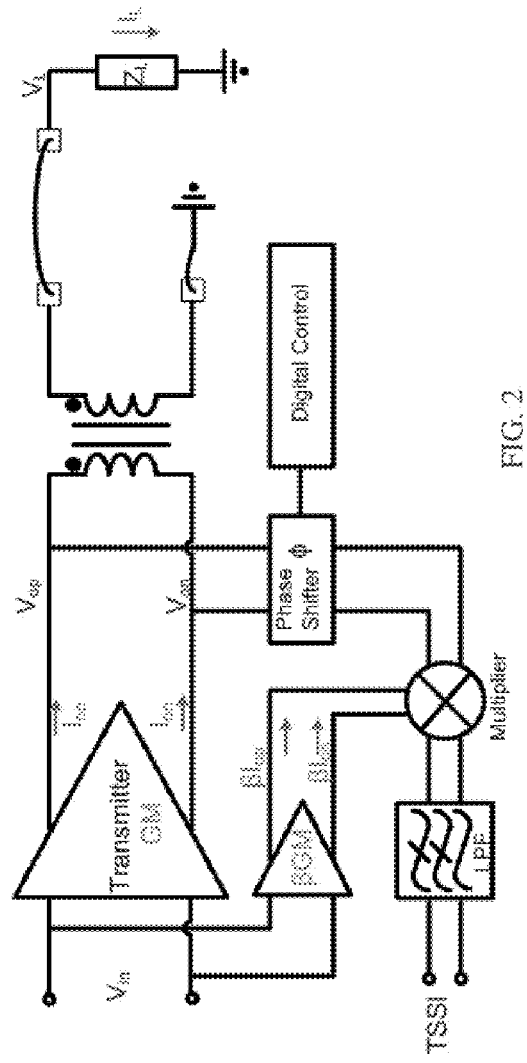
FIG. 2 shows a technique in which the voltage at the transmitter output and the current of the transmitter are measured and multiplied to obtain an indication of output power. Specifically, the current of the transmitter is measured by multiplying the transmitter input voltage with a replica of the transconductance cell.

FIG. 2 shows a technique that can reduce the error caused by the change in the load impedance. The voltage at the transmitter output and the current of the transmitter are measured and multiplied to obtain an indication of output power. Specifically, the current of the transmitter is measured by multiplying the transmitter input voltage with a replica of a transconductance cell. A phase shifter may account for the phase difference between the current and the voltage. However, the sensed current may not track the output current, which may lead to an inaccurate power measurement.

Figure 3B:
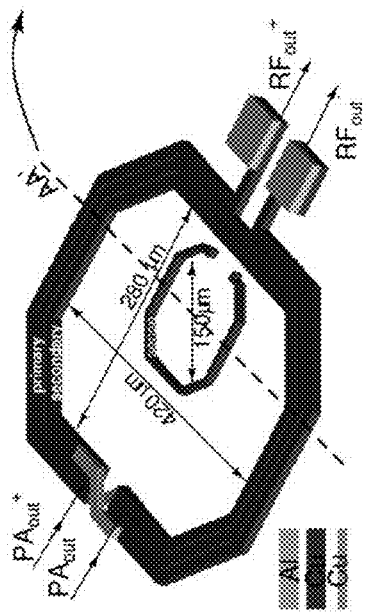
FIGS. 3A and 3B show another technique in which an additional coil is added to a transformer to measure current, and output voltage is sensed capacitively, as described in F. Francois, P. Reynaert, "A transformer-Coupled True-RMS Power Detector in 40 nm CMOS," ISSCC Dig. Tech. Papers, pp. 62-63, February 2014.
Figure 3A:
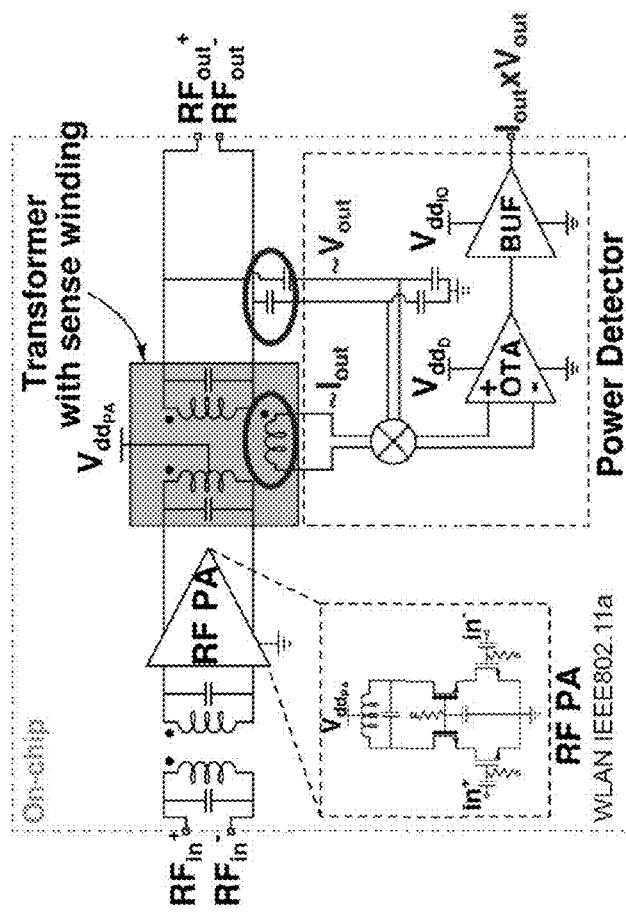

FIGS. 3A and 3B show another technique in which an additional coil is added to a transformer to measure current, and output voltage is sensed capacitively. However, the measured voltage and current are not equal to the load current and voltage, which may lead to an inaccurate power measurement.

In some embodiments, power may be detected by measuring the load current and the load voltage from conductors coupled to the load. A selected phase adjustment may be introduced to correct the phase difference between the measured current and the measured voltage that may arise due to the load impedance.

Figure 4:
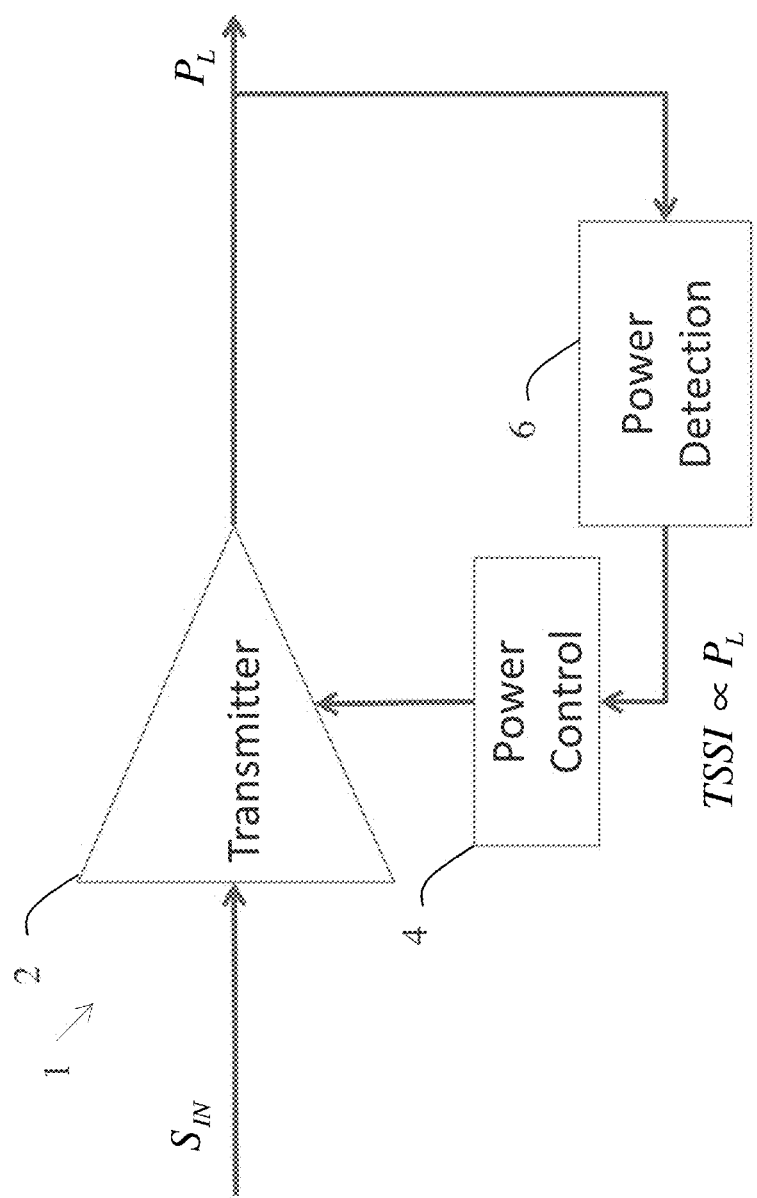
FIG. 4 shows a transmitter system with power control loop having a transmitter, a power control circuit, and a power detection circuit, according to some embodiments.

FIG. 4 shows a transmitter system with power control loop 1 having a transmitter 2, a power control circuit 4, and a power detection circuit 6. Power detection circuit 6 detects the load power $P_L$. In some embodiments, the load may be an antenna and the power $P_L$ may be the power delivered to the antenna. However, the techniques described herein are not limited to detecting the power delivered to an antenna. The transmitter 2 may produce a signal having any suitable frequency above 0 Hz. In some embodiments, the transmitter 2 may produce a signal having a frequency between 300 kHz and 300 GHz, however, the techniques described herein are not limited as to particular frequencies. The power detection circuit 6 may produce a TSSI (Transmitter Signal Strength Indication) that is proportional to $P_L$. The power control circuit 4 controls the transmitter 2 based upon the TSSI signal. Accurate power detection by the power detection circuit 6 is important for appropriate control of the transmitter 2.

Figure 5:
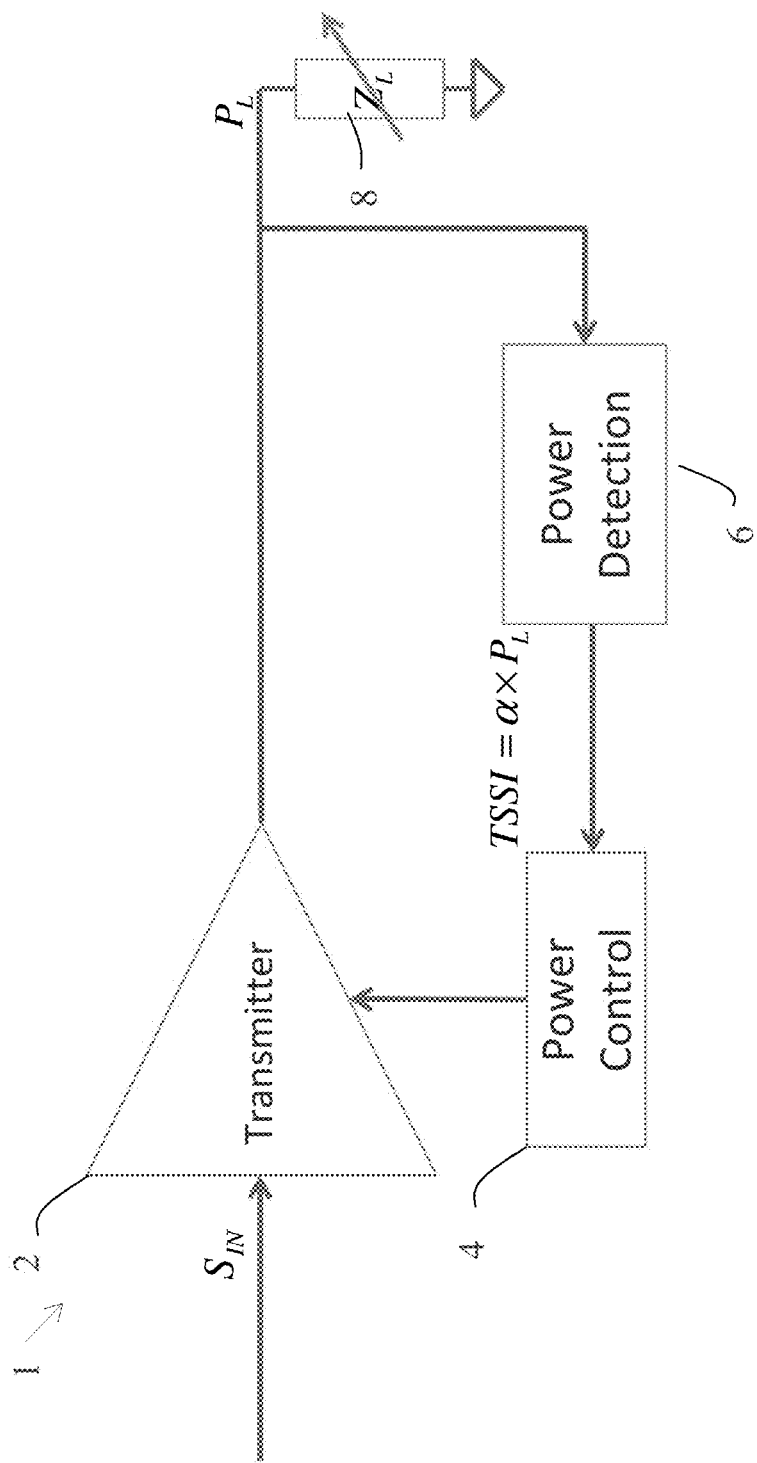
FIG. 5 illustrates a variable load impedance.

FIG. 5 illustrates a challenge with detecting the load power. If the load impedance $Z_L$ is variable, the gain or attenuation between load power and detected power changes as $Z_L$ changes.

Figures 6, 7:
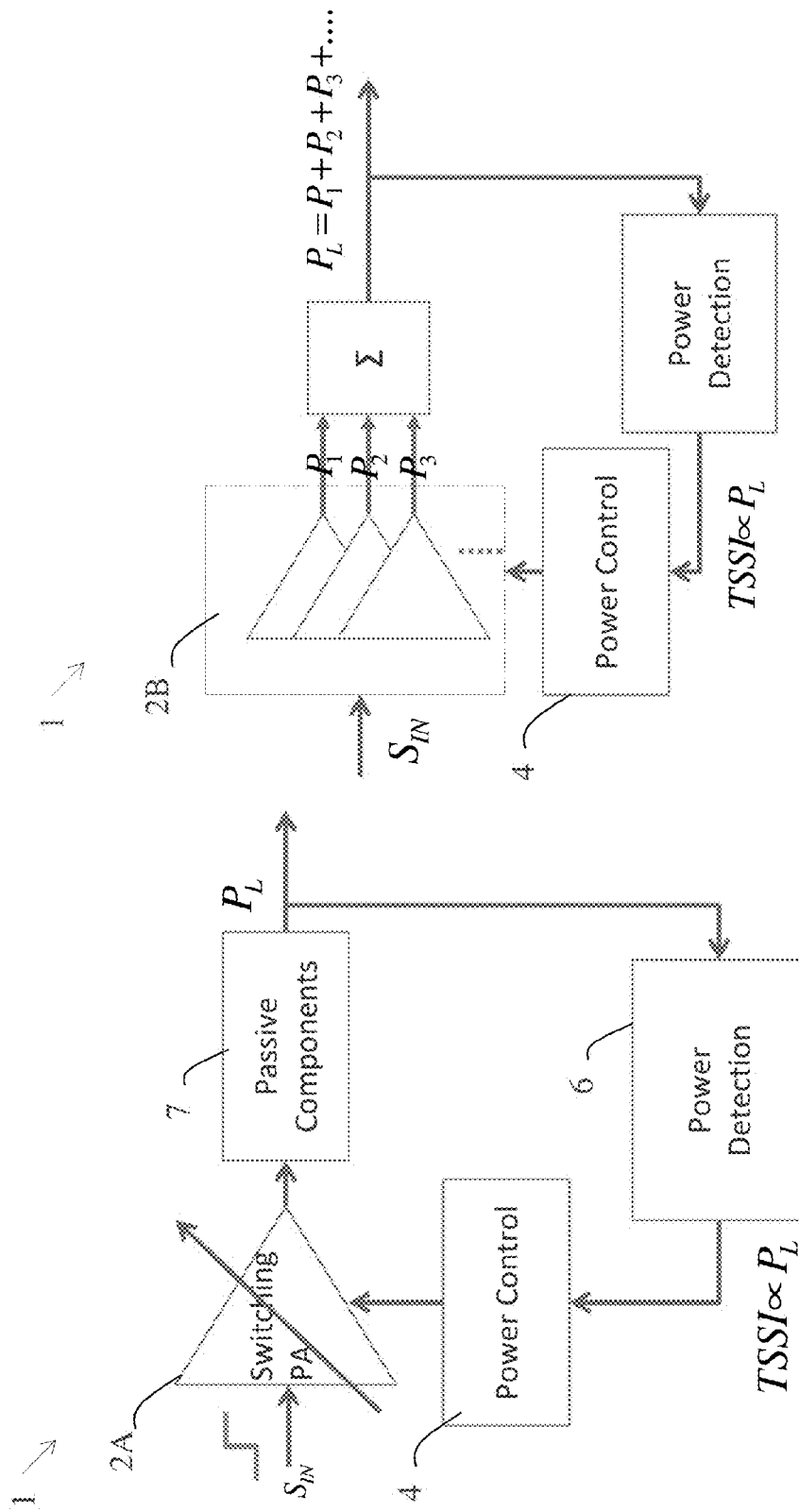
FIG. 6 illustrates a switching power amplifier.
FIG. 7 shows a power amplifier having a plurality of power amplifier circuits.

FIG. 6 illustrates that in some embodiments, the transmitter system with power control loop 1 may include a switching power amplifier 2A. The switching power amplifier 2A may be any suitable type of amplifier, including class D, E, and F power amplifiers, and digital power amplifiers. The power produced by switching power amplifier 2A may be controlled using any suitable control technique, such as pulse-width modulation, for example. In some embodiments, the switching power amplifier 2A may be controlled by power control circuit 4 based upon the TSSI signal. Since the switching power amplifier 2A is non-linear, it can be more effective to measure the power at the load rather than the input or output of the power amplifier 2A. FIG. 6 also shows that passive components 7 may be included between the output of the switching power amplifier 2A and the load. In some embodiments, the passive components 7 may tune out undesired harmonics. In some embodiments, passive components 7 may include an impedance matching network.

FIG. 7 shows that in some embodiments, the transmitter system with power control loop 1 may include a power amplifier 2B having a plurality of power amplifier circuits. The power from the plurality of power amplifier circuits may be combined and delivered to a load. Examples of such amplifiers include Doherty power amplifiers, outphasing power amplifiers and digital power amplifiers, Power control circuit 4 may control the power amplifier circuits based on the TSSI signal. Individual power amplifier circuits may be controlled to produce the same amount of power or different amounts of power. As with the circuit of FIG. 6, it can be more effective to measure the power at the load rather than the input or output of the power amplifier 2B.

Figure 8A:
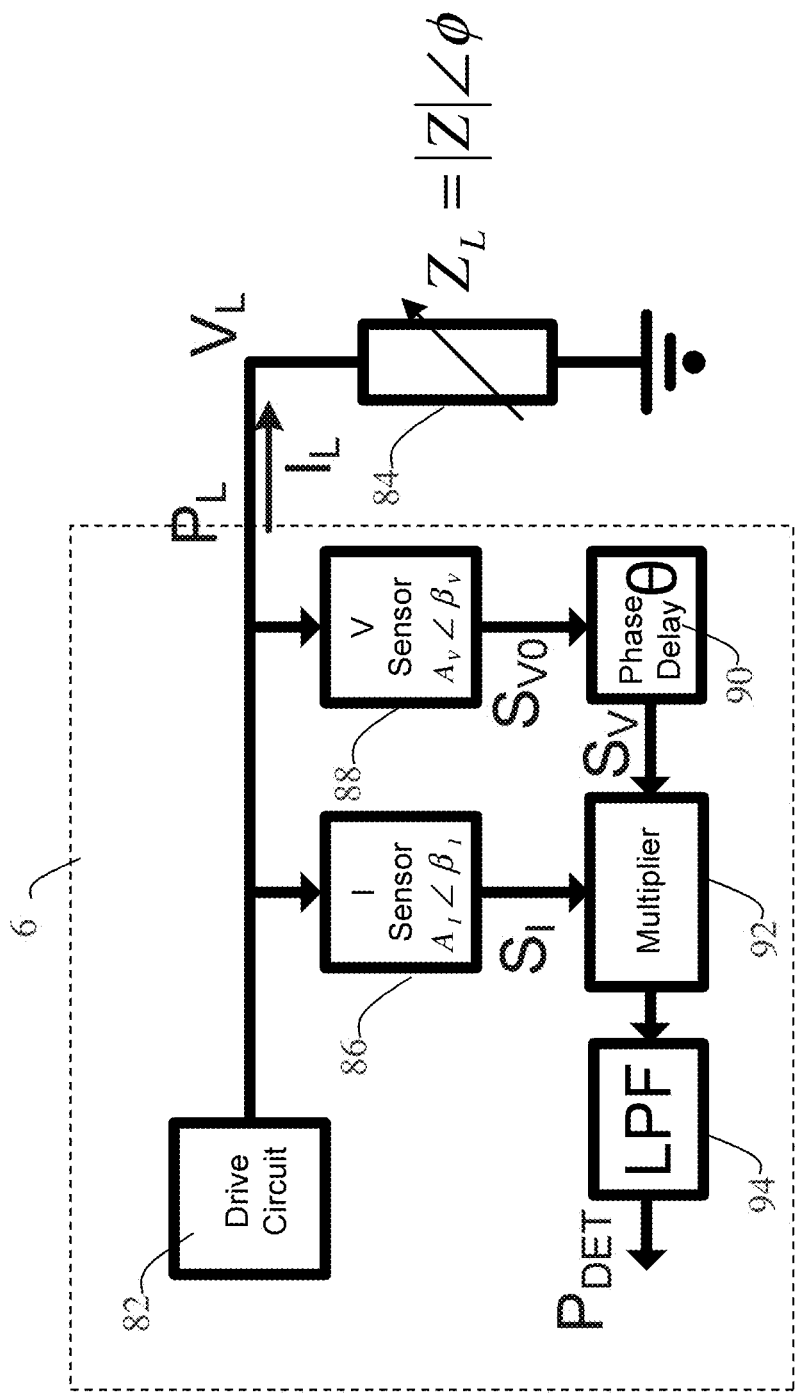
FIG. 8A illustrates a technique for detecting load power, according to some embodiments, in which a phase delay unit is present in the voltage sensing path.

FIG. 8A illustrates a technique for detecting load power, according to some embodiments. In the embodiment of FIG. 8A, a drive circuit 82 such as a power amplifier, for example, drives a load 84 having an impedance $Z_L$ with a current $I_L$, a voltage $V_L$ and power $P_L$. Load current $I_L$ may be measured by using a current sensor 86. Load voltage $V_L$ may be measured by using a voltage sensor 88. The inventors have recognized and appreciated that the magnitudes and phases of the measured current signal $S_I$ and the measured voltage signal $S_{VO}$ may vary as the load impedance $Z_L$ varies. Variation in the load impedance changes the voltage standing wave ratio (VSWR), which can produce different magnitudes and phases in the voltage and current measurements. In some embodiments, a phase delay θ may be added to the measured voltage signal $S_{VO}$ by a phase delay unit 90. The phase delayed voltage signal $S_V$ is multiplied by the measured current $S_I$ by a multiplier 92. The multiplied value may be low pass filtered by a low pass filter or averaging unit 94 to produce a determined load power $P_{DET}$. However, the techniques described herein are not limited to adding a phase delay to the signal measured by the voltage sensor 88, as in some embodiments a phase delay may be added to the signal measured by the current sensor 86, or different phase delays may be added to both the current and voltage measurements to achieve the same result.

The inventors have recognized and appreciated that a properly selected phase delay θ may accurately compensate for the variation in load impedance, which can produce an accurate power measurement. Although the power detector is capable of RMS power detection, sinusoidal waves are used to demonstrate the concept in the following analysis for simplicity. Assuming a complex load $Z_L$, with magnitude of |Z| and phase of ϕ, is presented to the drive circuit 82, the load voltage $V_L$ and load current $I_L$ can be represented by the following equations, where $V_m$ and $I_m$ are the magnitudes of the load voltage and the load current, respectively:

$$V_L = V_m \cos(\omega t + \phi) \tag{1}$$

$$I_L = \frac{V_m}{|Z|} \cos \omega t \tag{2}$$

And in phasor notation:

$$\overline{V}_L = V_m \angle \phi \tag{3}$$

$$\overline{I}_L = \frac{V_m}{|Z|} \tag{4}$$

The output of voltage sensor $S_{VO}$ has a linear relationship with the output voltage $V_L$, which does not change with |Z| or ϕ

$$S_{VO} = A_V \times V_L \cos \beta_V = A_V \times V_m \cos(\omega t + \phi + \beta_V) \tag{5}$$

$S_{VO}$ experiences a phase delay of θ

$$S_V = A_V \times V_m \cos(\omega t + \phi + \beta_V + \theta) \tag{6}$$

Similarly, the output of current sensor $S_I$ has a linear relationship with the output current $I_L$, which does not change with |Z| or ϕ

$$S_I = A_I \times \frac{V_m}{Z} \cos(\omega t + \beta_I) \tag{7}$$

The multiplier multiplies $S_V$ and $S_I$. The generated product is filtered by an averaging unit or low pass filter (LPF) 94:

$$P_{DET} = \int_0^{2\pi/\omega} S_V S_I dt \quad (8)$$

$$= \int_0^{2\pi/\omega} \frac{1}{2} A_V A_I \frac{|V_m|^2}{|Z|} [\cos(2\omega t + \beta_V + \beta_I + \phi + \theta) +$$

$$\cos(\phi + \theta + \beta_V - \beta_I)] dt$$

$$= \frac{1}{2} \frac{|V_m|^2}{|Z|} \cos(\phi + \theta + \beta_V - \beta_I)$$

$$\propto \frac{1}{2} \vec{V}_L \times \vec{I}_L^* = P_L$$

if $(\theta + \beta_V - \beta_I) = 0$

Therefore, $P_{DET}$ is linearly proportional to the delivered load power and independent of the load impedance variation, if $(\theta+\beta_V-\beta_I)=0$. The inventors have appreciated that mathematically, accurate power detection may be obtained by properly selecting $\theta$, which makes the measurement insensitive to VSWR changes. The phase delay $\theta$ that is appropriate for a particular implementation may be selected by calibration, modeling and/or simulation. In some embodiments, the phase delay $\theta$ is tunable, which allows compensating for variations in temperature and frequency as well as processing variations.

In some embodiments, one or more attenuators and/or amplifiers may be included in the signal path(s) before or after the sensor(s), which may extend the dynamic range of the power detector. Such attenuator(s) and/or amplifier(s) may be considered part of the current sensor 86 and/or the voltage sensor 88. This is illustrated in FIG. 8A as a gain $A_I$ of the current sensor 86 and a gain $A_v$ of the voltage sensor 88. The gain $A_I$ and/or the gain $A_v$ may have a value less than one to attenuate a detected signal, equal to one to produce no attenuation or amplification, or greater than one to amplify a detected signal. The attenuators and/or amplifiers may be implemented in analog and/or digital circuitry.

Figure 8B:
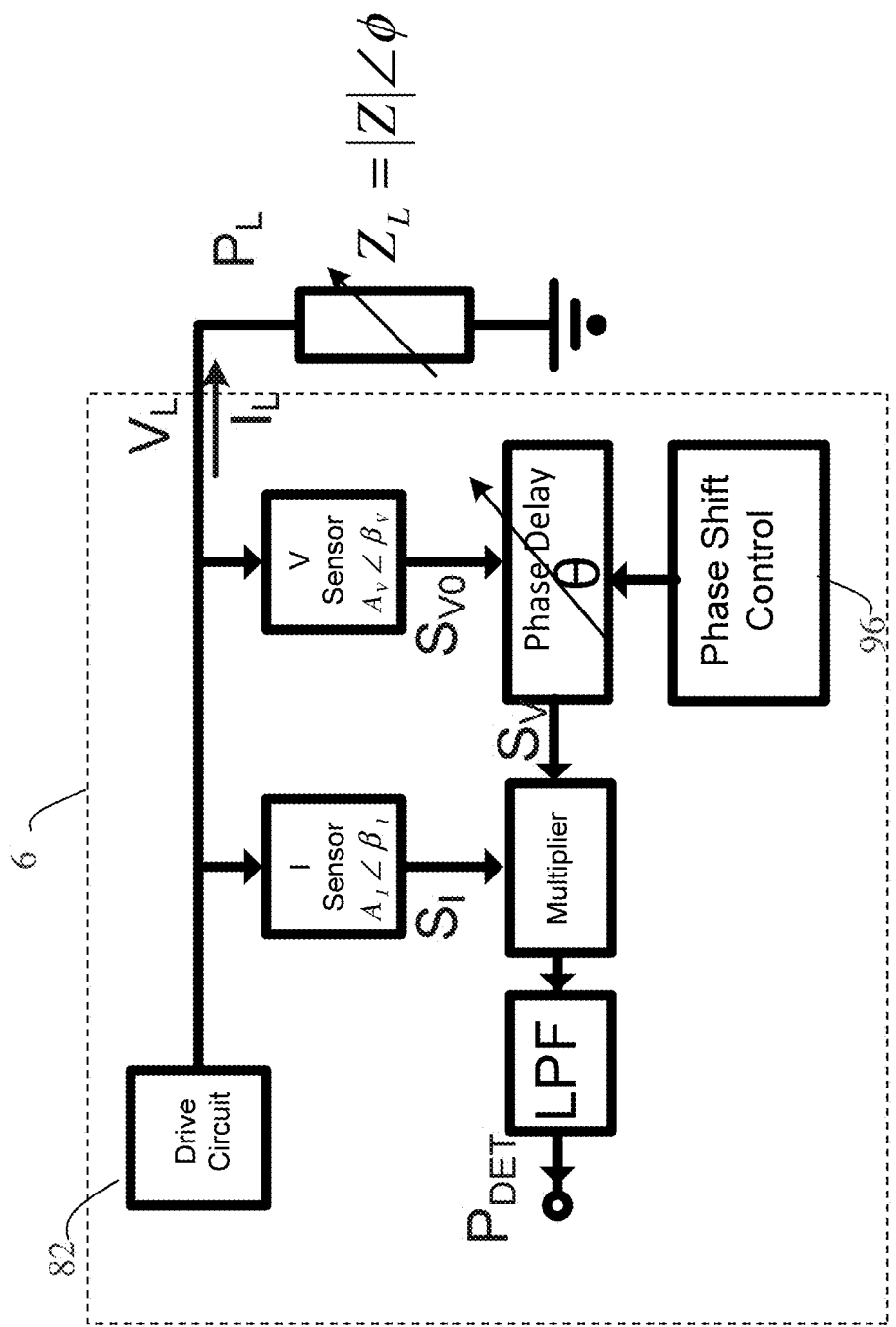
FIG. 8B shows an embodiment with a controller for controlling and/or calibrating the phase delay.
Figure 8C:
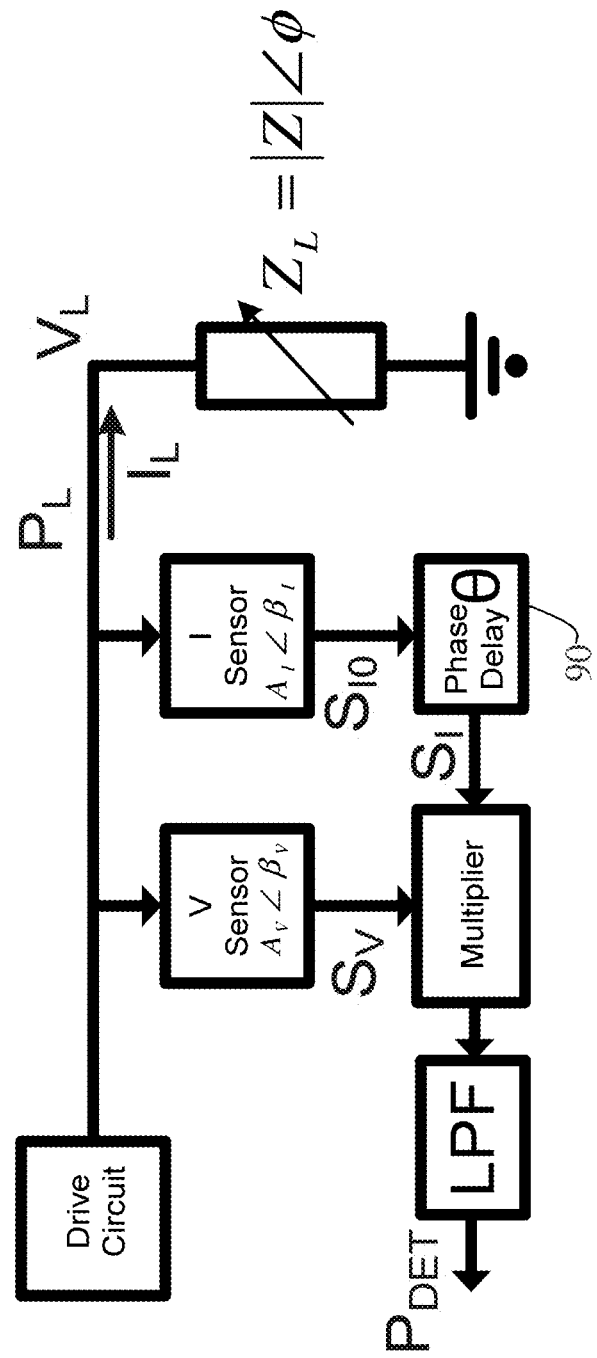
FIG. 8C illustrates a technique for detecting load power, according to some embodiments, in which a phase delay unit is present in the current sensing path.
Figure 8D:
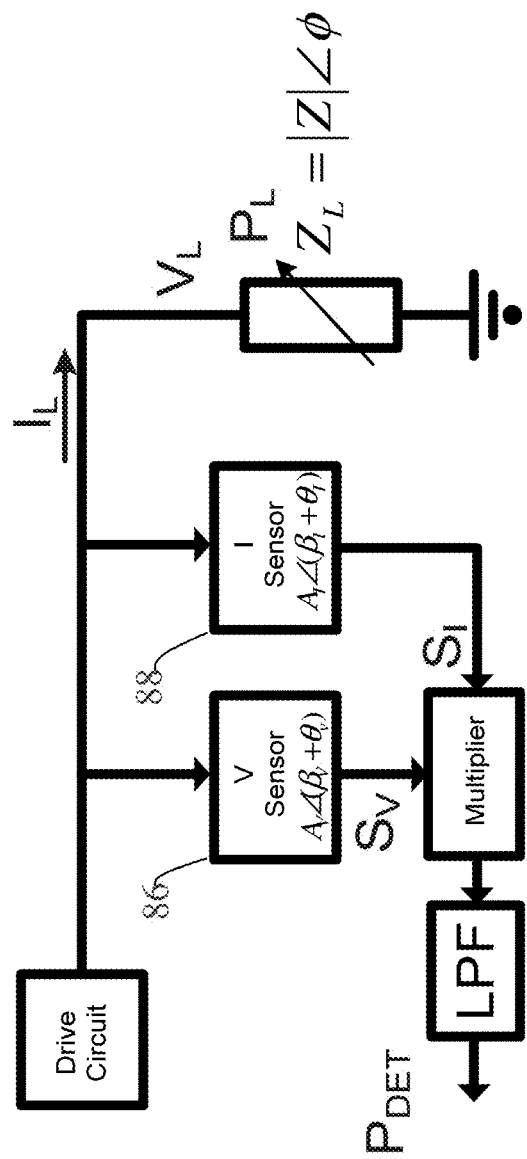
FIG. 8D shows an embodiment in which a phase delay may be introduced in the voltage and/or current sensing path in the voltage and/or current sensors.
Figure 8E:
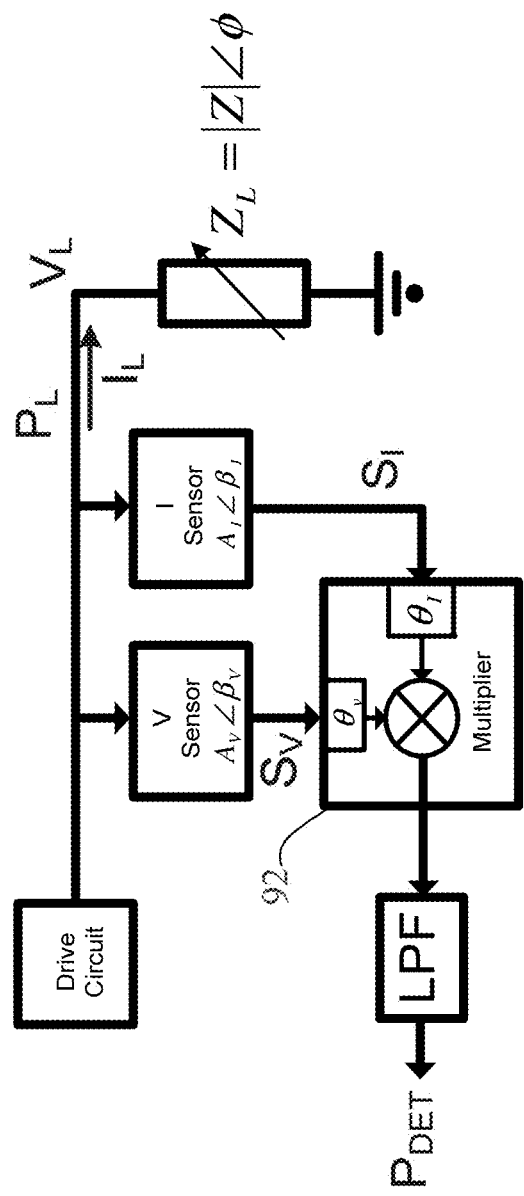
FIG. 8E shows an embodiment in which a phase delay may be introduced in the voltage and/or current sensing path in a multiplier.
Figure 8F:
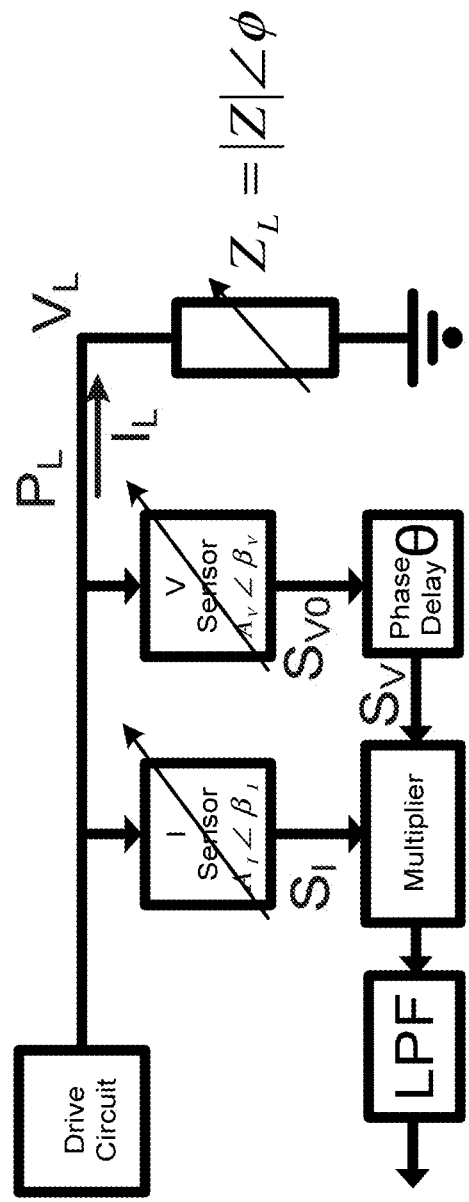
FIG. 8F shows variable gains $A_I$ and $A_V$ in the current sense path and the voltage sense path.

As shown in FIG. 8F, in some embodiments, the gain $A_I$ and/or the gain $A_v$ may be variable. For example, the one or more attenuators and/or amplifiers may be tunable to produce selected gain(s) in the current and/or voltage sense path.

FIG. 8B shows an embodiment in which the phase delay $\theta$ is tunable and may be calibrated. FIG. 8B shows a phase shift controller 96 may be included in power detection circuit 6 that can control the phase delay $\theta$. In some embodiments, the phase shift controller 96 may calibrate the phase delay $\theta$ based on a programmed calibration sequence. Phase shift controller 96 and power control circuit 4 may be implemented by the same controller (e.g., a microprocessor or control circuit) or different controllers.

FIG. 8C shows an embodiment for detecting load power, according to some embodiments, in which a phase delay unit 90 is present in the current sensing path. In such embodiments, the phase delay may be tunable and/or may be calibrated, as discussed above. In some embodiments, phase delays may be introduced in both the current sensing path and the voltage sensing path.

FIG. 8D shows an embodiment in which a phase delay may be introduced in the voltage and/or current sensing path in the voltage and/or current sensors. For example, a phase delay $\theta_v$ may be introduced in the signal measured by the voltage sensor 86, a phase delay $\theta_I$ may be introduced in the signal measured by the current sensor 88, or both phase delays $\theta_v$ and $\theta_I$ may be introduced. Phase delays $\theta_v$ and $\theta_I$ may be introduced digitally or using analog components.

FIG. 8E shows an embodiment in which a phase delay may be introduced in the voltage and/or current sensing path in a multiplier 92, which may be a circuit and/or software. For example, a phase delay $\theta_v$ may be introduced to $S_V$, a phase delay $\theta_I$ may be introduced to $S_I$, or both phase delays $\theta_v$ and $\theta_I$ may be introduced. Thus, as seen from the above, one or more phase delays may be introduced anywhere in the voltage and/or current sensing paths.

Referring to FIG. 8A, in some embodiments, the voltage sensor 88 may include a conductor or other circuit element coupled to the load. For example, as discussed below, the conductor of the voltage sensor 88 may be a bondwire, trace, solder ball, via, coupled line or and/or any other suitable conductor.

In some embodiments, the current sensor 86 may be a conductor that is positioned to inductively sense the load current from a conductor that provides the load current to the load. For example, as discussed below, the conductor of the current sensor 86 may be a bondwire, trace, solder ball, via, coupled line or and/or any other suitable conductor.

The phase delay unit 90, multiplier 92 and low pass filter and/or averaging unit 94 may be implemented using analog or digital component(s). For example, the phase delay unit 90 may be an analog circuit element that delays a signal. As another example, the phase delay unit 90 may be implemented digitally using a digital delay element or by converting $S_{V0}$ and/or $S_I$ to digital values and digitally delaying one or both signals. As discussed above, phase delay unit 90 may produce a delay $\theta$ that is tunable. If phase delay unit 90 is implemented digitally, the phase delay unit 90 may be controlled to change the delay using a programmable delay line, software or firmware, for example. Similarly, multiplier 92 may be implemented using an analog circuit or digitally using digital components and/or software or firmware. Also, the low pass filter and/or averaging unit 94 may be implemented using an analog circuit, a digital circuit, or in software or firmware. The low pass filter and/or averaging unit 94 need not be a "filter" per se, as it may implement any suitable time-averaging technique.

Figure 9:
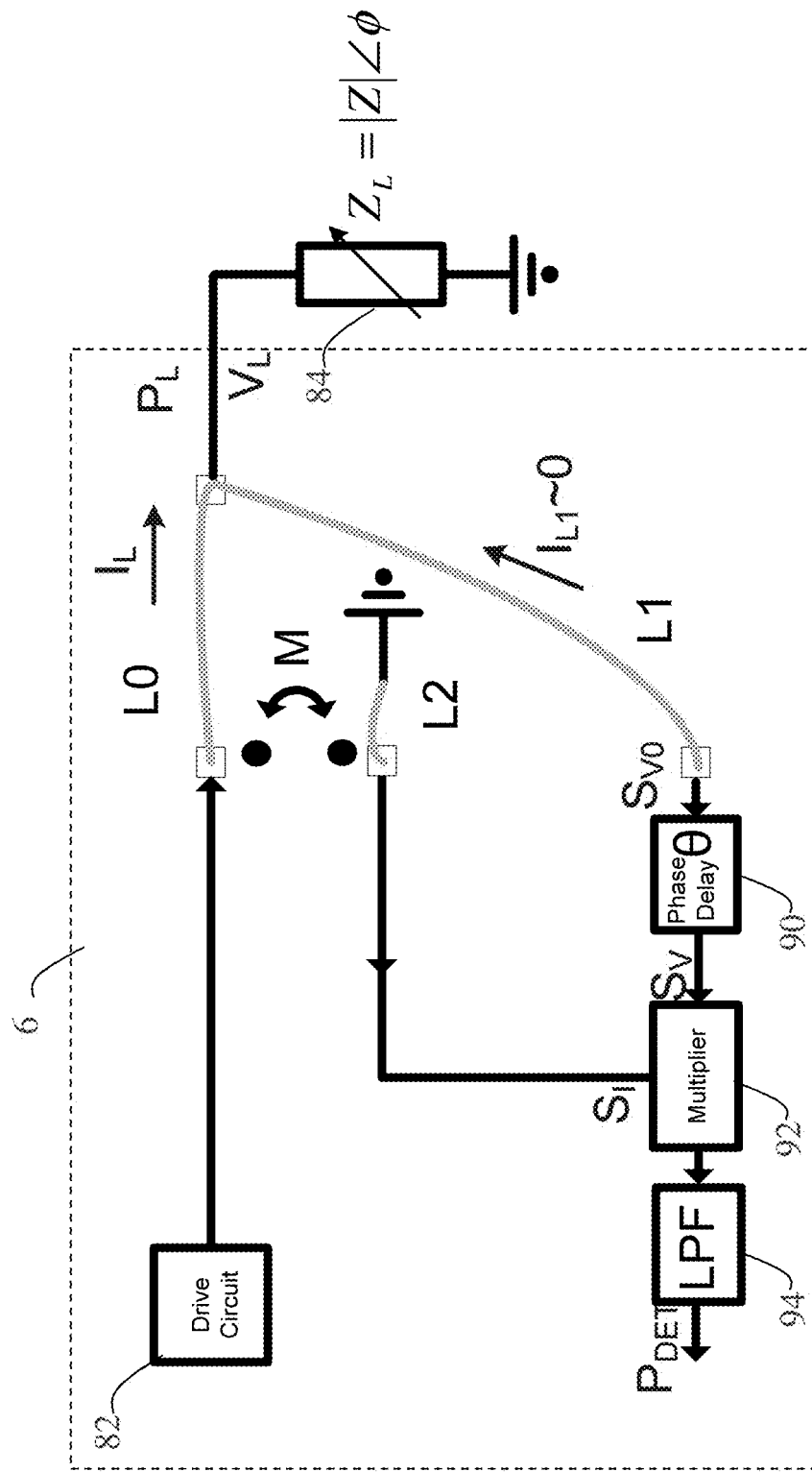
FIG. 9 shows an embodiment in which the current and voltage sensors are conductors.

FIG. 9 shows an embodiment in which a conductor L0 connects the drive circuit 82 to the load 84. A second conductor L1 is coupled to the load 84 to make a voltage measurement $S_{V0}$ that is provided to the phase delay unit 90. Conductor L1 is an example of a voltage sensor 88. Phase delay unit 90 may be a circuit that presents a high impedance to L1, thus the current $I_{L1}$ flowing through L1 is zero, so $S_{V0}$ is a faithful copy of $V_L$. A third conductor L2, coupled between the multiplier 92 and ground, is positioned proximate the conductor L0, and due to inductive coupling, a current through conductor L0 induces a current in conductor L2, which is provided as a measurement $S_I$ of the load current $I_L$. Thus, conductor L2 is an example of a current sensor 86. If L0 and L2 are inductors, $S_I$ will be a faithful copy of $I_L$ with close to a 900 phase shift if the multiplier input impedance is high. By inserting a $\theta$=90° phase shift between L1 and the multiplier 92, $P_{DET}$ will be a faithful copy of $P_L$, independent of the change of |Z| or $\phi$. In some embodiments, the conductors L0, L1 may be bondwires. However, the techniques described herein are not limited in this respect, as any suitable conductors may be used such as solder balls, vias, traces, or coupled lines, by way of example and not limitation.

Figure 10A:
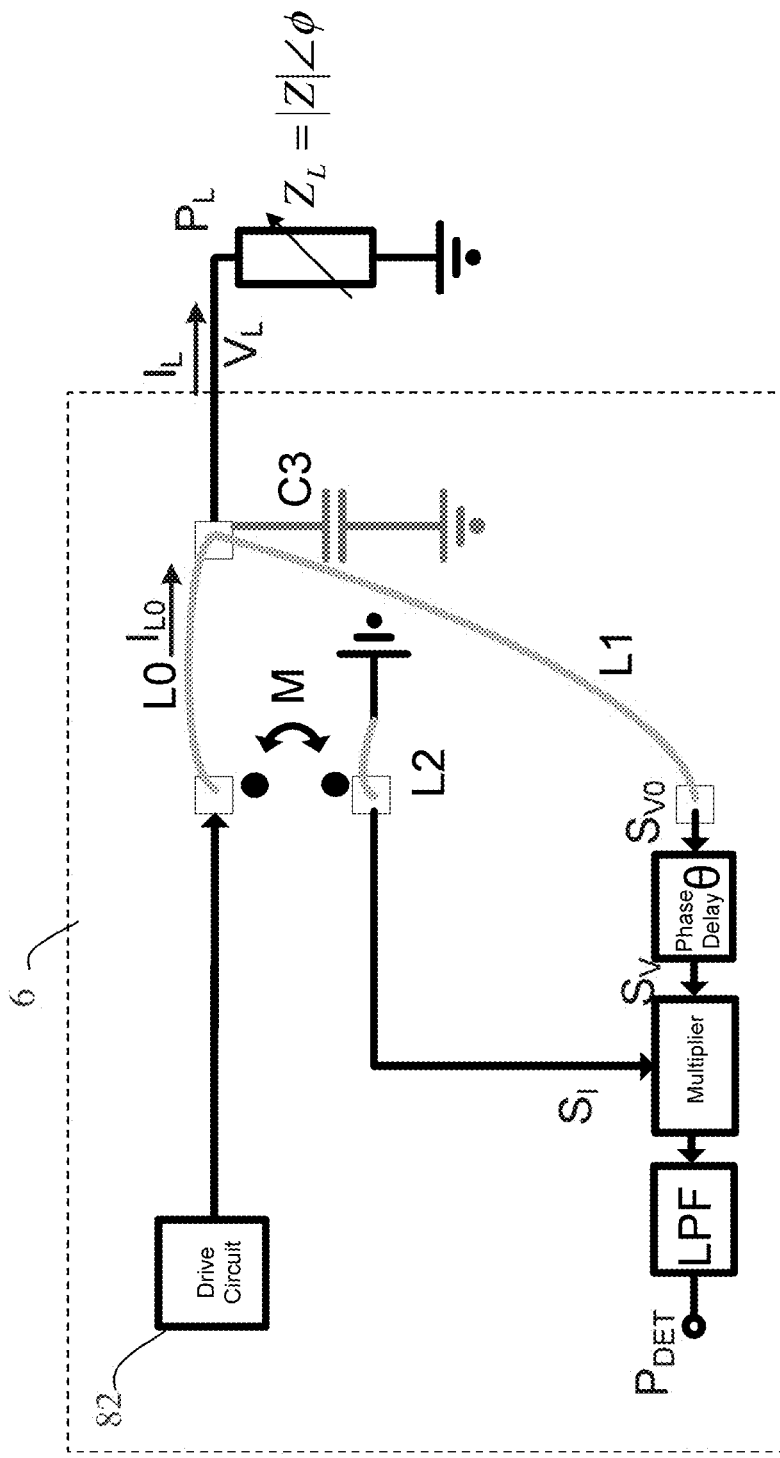
FIGS. 10A-D show solutions to address to parasitics, especially for high frequency applications, according to some embodiments.
Figure 10B:
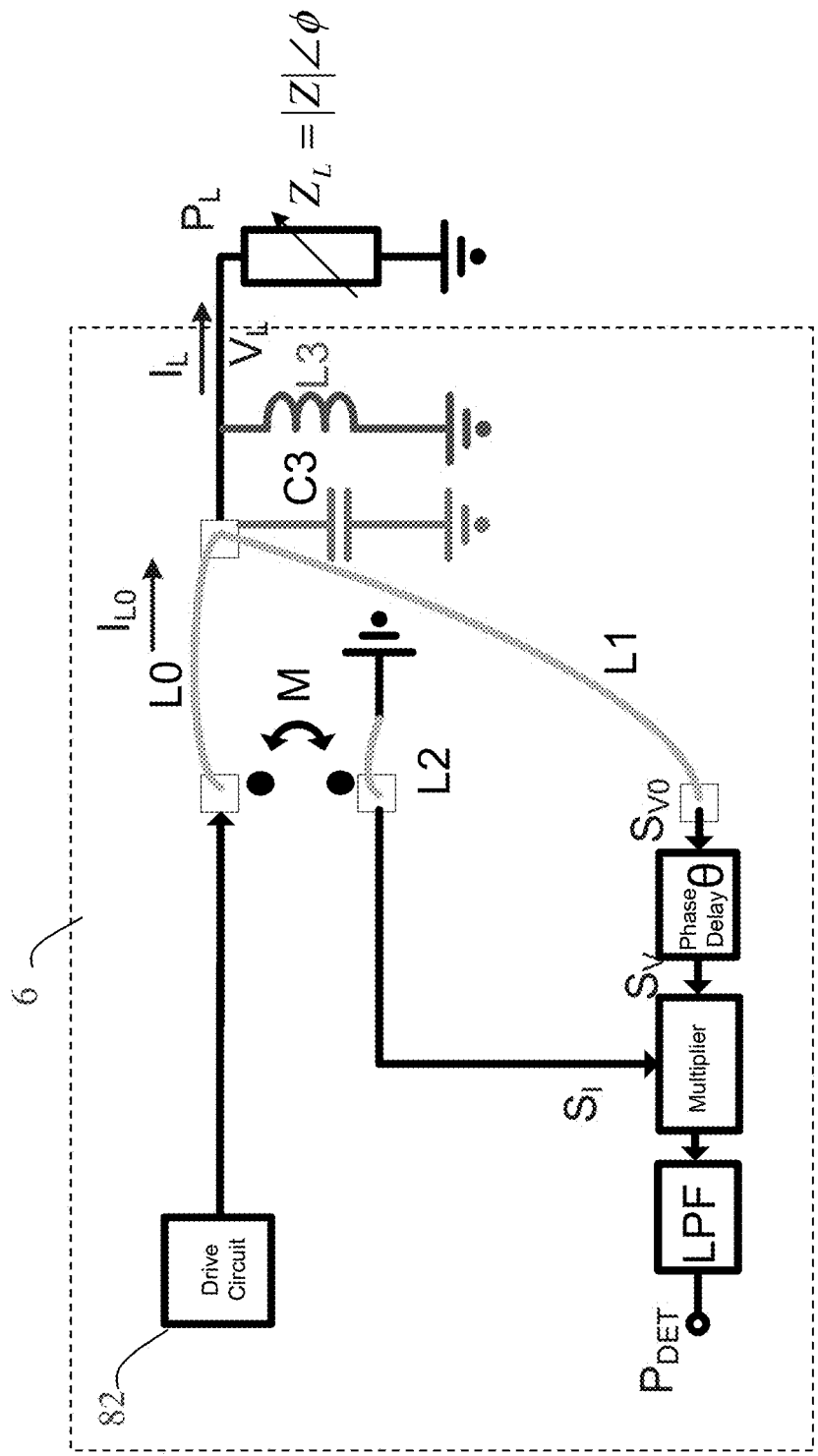

FIG. 10A-D address possible implementation issues related to parasitics, especially for high frequency applications. For the sake of discussion, L0 and L2 are assumed to be inductors. In FIG. 10A, the sensed current $S_I$ deviates from $I_L$ because of current flowing through the parasitic capacitor C3. The effect of the parasitic capacitor C3 can be compensated as shown in FIG. 10B. In FIG. 10B, an inductor L3 is coupled between the ground and the output node coupled to the load, having an inductance selected to resonate with C3 at the operating frequency, which cancels the current through C3. Accordingly, $S_I$ will be a faithful copy of $I_L$.

Figure 10C:
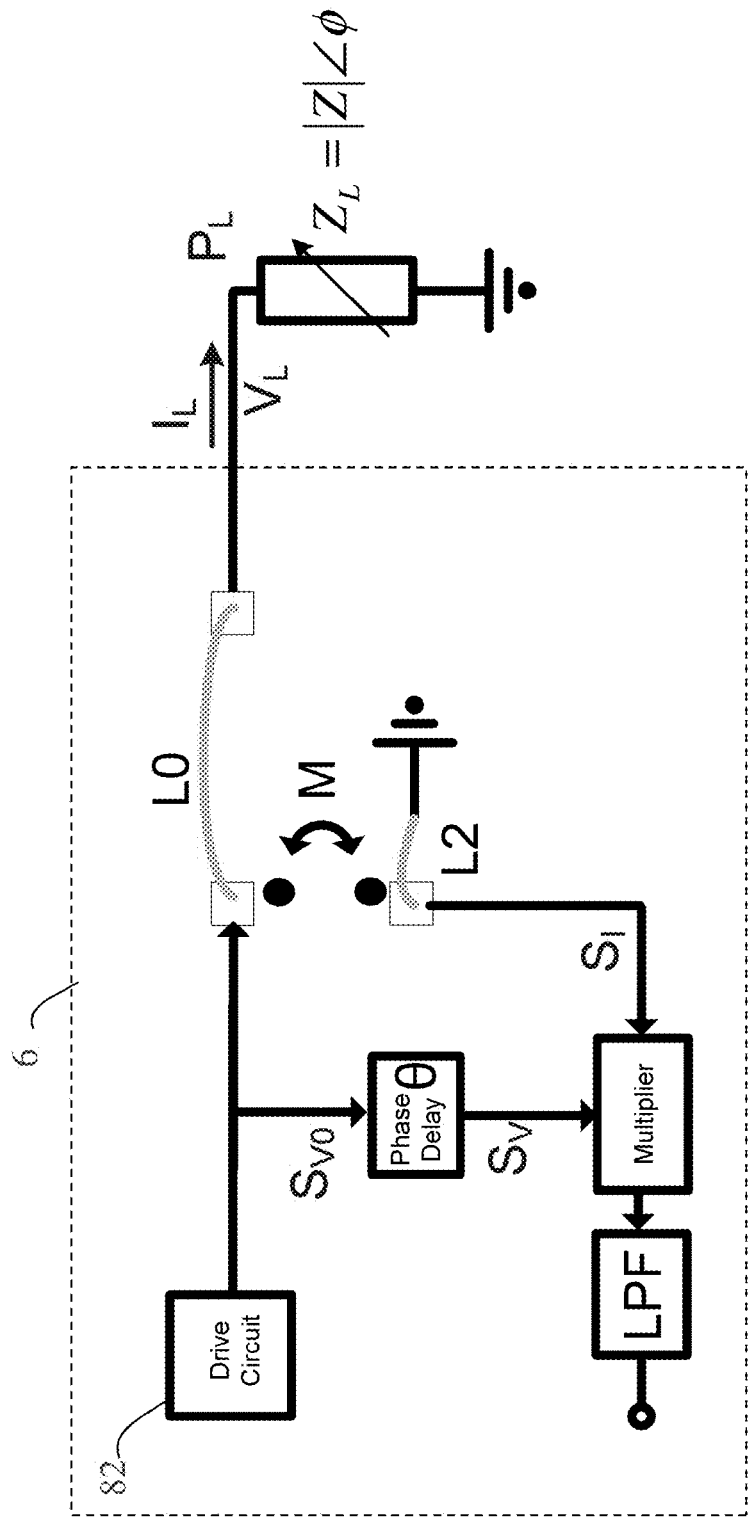
Figure 10D:
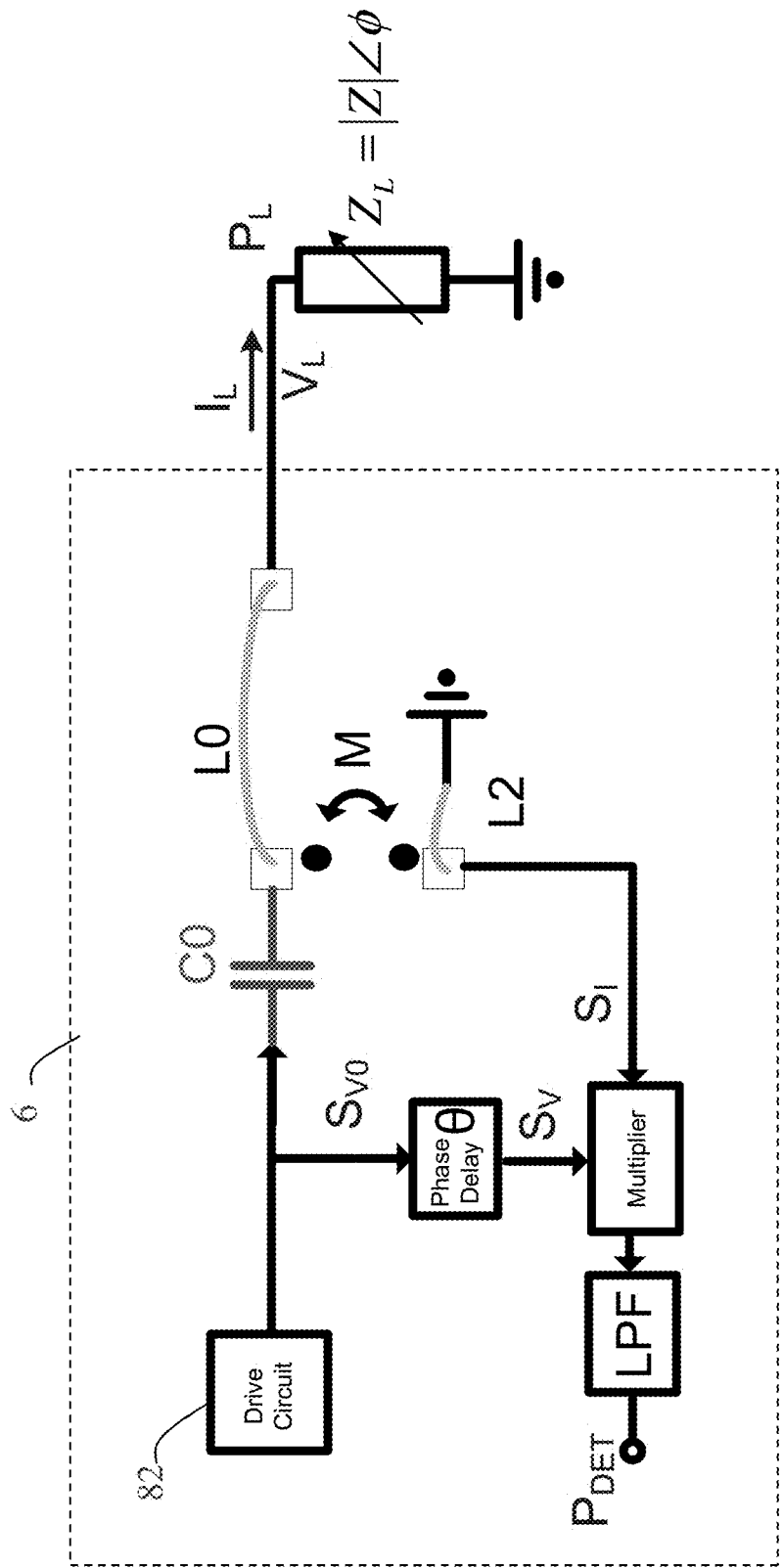

FIG. 10C shows an example in which $S_{V0}$ is measured from the output of the drive circuit 82. Due to the current flowing through L0, which has an inductance, $S_{V0}$ deviates from $V_L$. As shown in FIG. 10D, a capacitor C0 can be inserted coupled between L0 and the drive circuit 82, with a capacitance selected to resonate with L0 at the operating frequency. Thus, $S_{V0}$ is a faithful copy of $V_L$.

Figure 10E:
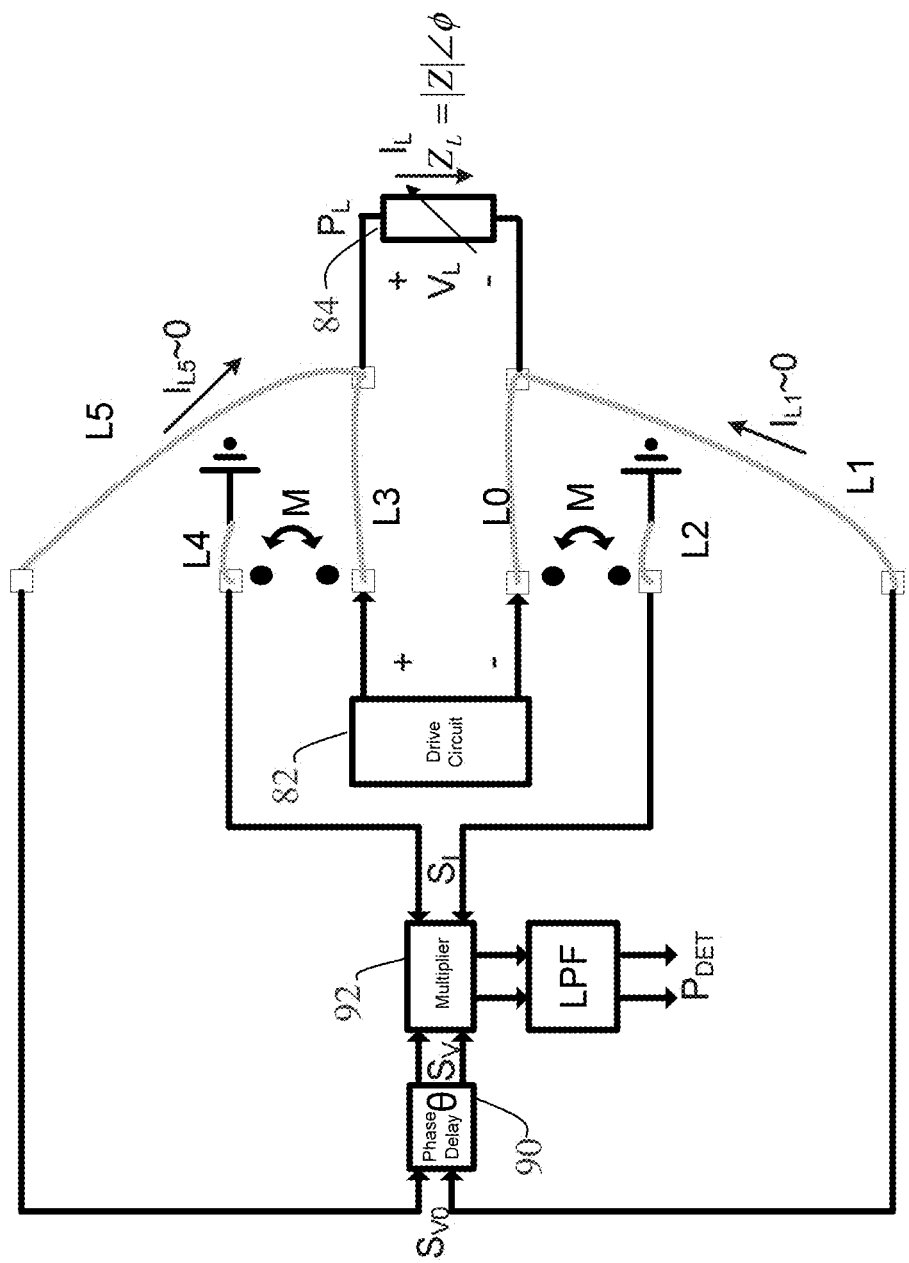
FIG. 10E shows a differential implementation of a power detector that can detect power from a drive circuit that is differentially connected to a load

FIG. 10E shows a differential implementation of a power detector that can detect power from a drive circuit 82 that is differentially connected to a load 84. Conductors L3 and L0 couple the positive and negative output terminals of the drive circuit 82 to the positive and negative terminals of the load 84, respectively. Conductors L5 and L1 are coupled to the load 84 to make a voltage measurement at the positive and negative terminals of the load 84, respectively. The voltage measurements from conductors L5 and L are provided to phase delay unit 90, which delays the differential voltage measurement and provides it to multiplier 92. Conductors L4 and L2 are inductively coupled to conductors L3 and L0, respectively, and produce current measurements that are provided to multiplier 92. Multiplier 92 multiplies the differential current measurement and delayed voltage measurement. In some embodiments, and as discussed above, the phase delay may be introduced in the current sensing path, or in both the voltage sensing path and current sensing path. In the example of FIG. 10E, both current and voltage are measured differentially. However, the techniques described herein are not limited to measuring both current and voltage differentially, as a combination of a single-ended measurement and differential measurement may be used. For example, voltage may be measured differentially and current may be measured using a single-ended configuration, or current may be measured differentially and voltage may be measured using a single-ended configuration.

Figure 11A:
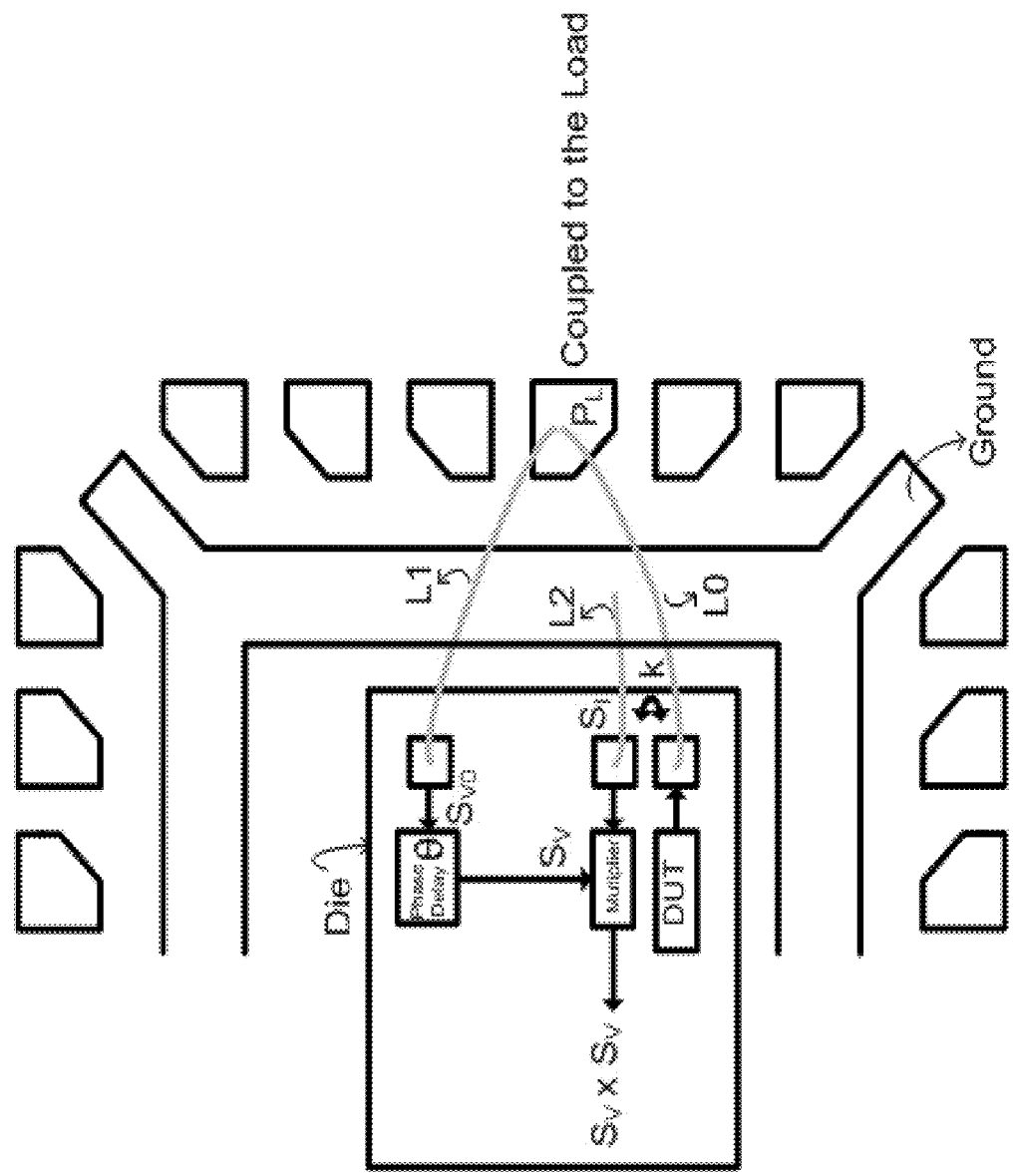
FIGS. 11A and 11B show ways to implement the techniques described herein with different packages.
Figure 11B:
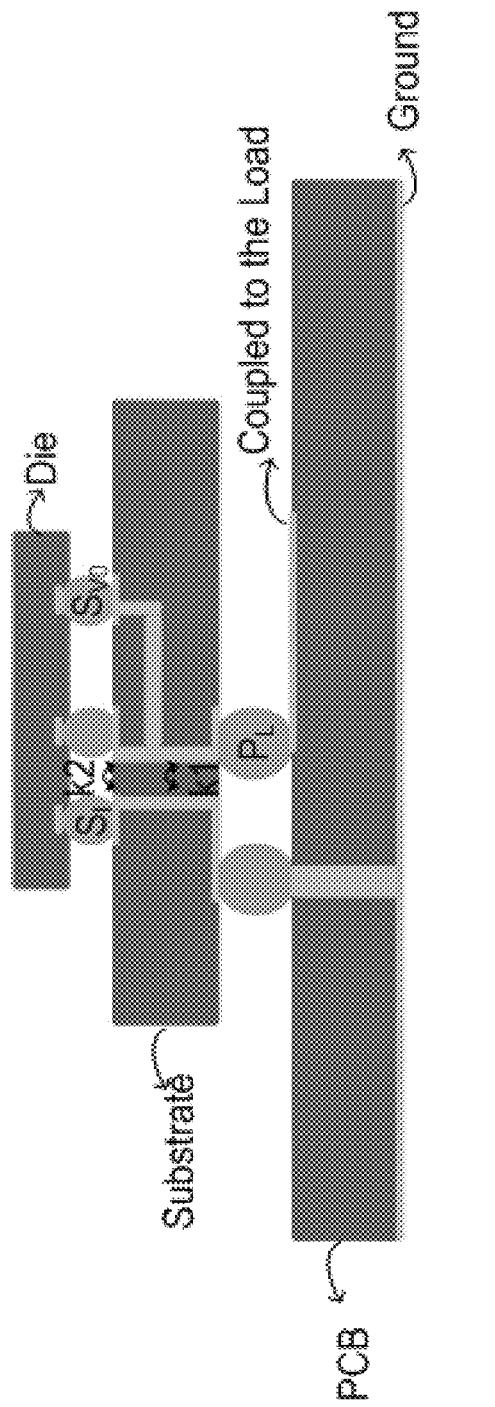

FIGS. 11A and 11B show ways to implement the above-described techniques with different packages. FIG. 11A shows a way to implement the power sensing technique in a SOC (system on chip) with a QFN (Quad flat no-lead) package. A bondwire L0 is used to couple the output of the drive circuit 82 to the QFN load pin. A separate bondwire L1 is arranged to sense the load voltage, coupled to the phase delay unit 90. An additional bondwire L2, coupled to the QFN ground terminal, is placed proximate L0 to sense the load current. Similarly, as shown in FIG. 11B, the power sensing scheme can be implemented in CSP (chip-scale package) type package. The current sensing can be accomplished with magnetic couplings between either the vias (k1) or the coupled lines (k2). Solder balls are shown as connecting the die, substrate and PCB.

In some embodiments, controller 96 and/or power control circuit 4 may be implemented using hardware or a combination of hardware and software. When implemented using software, suitable software code can be executed on any suitable processor (e.g., a microprocessor) or collection of processors. The one or more controllers can be implemented in numerous ways, such as with dedicated hardware, or with general purpose hardware (e.g., one or more processors) that is programmed using microcode or software to perform the functions recited above.

Various aspects of the apparatus and techniques described herein may be used alone, in combination, or in a variety of arrangements not specifically discussed in the embodiments described in the foregoing description and is therefore not limited in its application to the details and arrangement of components set forth in the foregoing description or illustrated in the drawings. For example, aspects described in one embodiment may be combined in any manner with aspects described in other embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. A power detector, comprising:
   a voltage sensor configured to detect a voltage of a load;
   a current sensor configured to detect a current of the load; and
   circuitry configured to:
   add a phase delay to the detected voltage of the load, the detected current of the load, or both the detected voltage of the load and the detected current of the load, to compensate for a variation in an impedance of the load and make a power measurement insensitive to changes in voltage standing wave ratio (VSWR), thereby producing a voltage measurement and a current measurement; and
   multiply the voltage measurement and the current measurement to produce the power measurement.

2. The power detector of claim 1, wherein the voltage sensor comprises a conductor or a circuit element.

3. The power detector of claim 2, wherein the voltage sensor comprises the conductor, and the conductor comprises at least one of a bondwire, a coupled line, a via and a solder ball.

4. The power detector of claim 1, wherein the current sensor comprises a conductor or a circuit element.

5. The power detector of claim 4, wherein the current sensor comprises the conductor, and the conductor comprises at least one of a bondwire, a coupled line, a via and a solder ball.

6. The power detector of claim 4, wherein the current sensor comprises the conductor, and the conductor is positioned to inductively sense the current of the load.

7. The power detector of claim 1, wherein the phase delay is tunable.

8. The power detector of claim 7, wherein the phase delay is calibrated to account for processing variations, variations in temperature and/or variations in frequency.

9. The power detector of claim 1, further comprising a low pass filter and/or averaging unit to filter and/or average a product of the current measurement and the voltage measurement.

10. The power detector of claim 1, implemented in a quad flat-lead package or chip scale package.

11. The power detector of claim 1, wherein the load is driven by an amplifier.

12. The power detector of claim 11, wherein the amplifier comprises a switching amplifier.

13. The power detector of claim 11, wherein the amplifier comprises a plurality of amplifier circuits that combine their outputs to drive the load.

14. The power detector of claim 1, wherein the load comprises an antenna.

15. The power detector of claim 1, wherein the voltage and current of the load have a frequency of higher than 0 Hz.

16. The power detector of claim 1, further comprising a circuit element to resonate with a parasitic inductance or capacitance at a frequency of operation of the load.

17. The power detector of claim 16, wherein the circuit element comprises an inductive element that resonates with a parasitic capacitance, the parasitic capacitance being in parallel with the load.

18. The power detector of claim 16, wherein the circuit element comprises a capacitive element that resonates with a parasitic inductance, the parasitic inductance being in series with the load.

19. The power detector of claim 1, wherein the phase delay is introduced in at least one of a voltage sensing path and a current sensing path.

20. The power detector of claim 19, wherein the phase delay is introduced in at least one of the voltage sensor, the current sensor, a phase delay unit in a current path, a phase delay unit in a voltage path, and a phase delay element in a multiplier circuit.

21. The power detector of claim 1, wherein the voltage sensor is a differential voltage sensor and/or the current sensor is a differential current sensor.

22. The power detector of claim 1, wherein the phase delay is introduced in at least one of the current sensor, the voltage sensor, a phase delay unit, and a multiplier.

23. The power detector of claim 1, further comprising circuitry configured to amplify and/or attenuate the detected voltage of the load and/or the detected current of the load.

24. The power detector of claim 1, further wherein the circuitry is configured to amplify and/or attenuate the detected voltage of the load and/or the detected current of the load by a tunable gain.

25. A power detection method, comprising,
detecting a voltage of a load;
detecting a current of the load;
add a phase delay to the detected voltage of the load, the detected current of the load, or both the detected voltage of the load and the detected current of the load, to compensate for a variation in an impedance of the load and make a power measurement insensitive to changes in voltage standing wave ratio (VSWR), thereby producing a voltage measurement and a current measurement; and
multiplying the voltage measurement and the current measurement to produce the power measurement.

26. The power detection method of claim 25, further comprising calibrating the phase delay.

27. The power detection method of claim 25, wherein the current of the load is detected inductively.

28. The power detection method of claim 25, further comprising low-pass filtering a product of the voltage measurement and the current measurement.

* * * * *